United States Patent
Bottomley et al.

(10) Patent No.: US 7,602,838 B2
(45) Date of Patent: Oct. 13, 2009

(54) LINEAR TURBO EQUALIZATION USING DESPREAD VALUES

(75) Inventors: Gregory E. Bottomley, Cary, NC (US); Jung-Fu Cheng, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 620 days.

(21) Appl. No.: 11/314,740

(22) Filed: Dec. 22, 2005

(65) Prior Publication Data

US 2007/0147481 A1    Jun. 28, 2007

(51) Int. Cl.
  *H04B 1/00*  (2006.01)
  *H04B 1/10*  (2006.01)

(52) U.S. Cl. .................... 375/148; 375/144; 375/346

(58) Field of Classification Search ......... 375/140–144, 375/147, 148, 150, 340, 341, 346
See application file for complete search history.

(56) References Cited

U.S. PATENT DOCUMENTS

| | | | |
|---|---|---|---|
| 5,572,552 | A | 11/1996 | Dent et al. |
| 6,363,104 | B1 | 3/2002 | Bottomley |
| 6,683,924 | B1 | 1/2004 | Ottosson et al. |
| 6,714,585 | B1 | 3/2004 | Wang et al. |
| 6,922,434 | B2 | 7/2005 | Wang et al. |
| 7,443,928 | B2 * | 10/2008 | Nefedov et al. ............. 375/323 |
| 2003/0035469 | A1 | 2/2003 | Frank et al. |
| 2005/0078742 | A1 | 4/2005 | Cairns et al. |
| 2005/0111528 | A1 | 5/2005 | Fulghum et al. |
| 2005/0175131 | A1 | 8/2005 | Kansanen et al. |
| 2005/0180493 | A1 * | 8/2005 | Hooli et al. ................. 375/148 |
| 2005/0201447 | A1 | 9/2005 | Cairns et al. |
| 2005/0215218 | A1 | 9/2005 | Bottomley et al. |
| 2006/0062283 | A1 | 3/2006 | Zhang et al. |
| 2006/0068714 | A1 * | 3/2006 | Sharma et al. ........... 455/67.11 |
| 2006/0188007 | A1 * | 8/2006 | Daneshrad et al. .......... 375/148 |

OTHER PUBLICATIONS

Jong Park and Yeongyoon Choi; "Turbo Equalization for Wireless Cellular Systems;" IEICE Trans. Fundamentals, vol. E83-A, No. 6; Jun. 2000; pp. 1184 and 1185.

C. Douillard, M. Jézéquel, C. Berrou, A. Picart, P. Didier, and A. Glavieux; "Iterative Correction of Intersymbol Interference: Turbo-Equalization;" ETT, vol. 6, No. 5; Sep.-Oct. 1995; pp. 507-511.

(Continued)

*Primary Examiner*—David B Lugo
(74) *Attorney, Agent, or Firm*—Nixon & Vanderhye P.C.

(57) ABSTRACT

A linear turbo-equalizer for use in a CDMA receiver equalizes a despread received signal (rather than the spread received signal) to suppress self-interference resulting from coupling between transmitted symbols. In an example implementation, a linear equalizer based on a generalized-Rake (G-Rake) receiver design uses decoder feedback in forming Rake combining weights as well as in forming a self-interference estimate removed from the equalizer signal provided to the decoder. Preferably, turbo de-coding is also performed. In that case, each turbo-decoder component preferably executes one pass before feeding back information to the equalizer. This ensures that the turbo-decoder does not prematurely lock onto an incorrect code word before feeding back extrinsic information to the equalizer.

48 Claims, 9 Drawing Sheets

OTHER PUBLICATIONS

C. Frank, E. Visotsky, and U. Madhow; "Adaptive Interference Suppression for the Downlink of a Direct Sequence CDMA System with Long Spreading Sequences;" Journal of VLSI Signal Processing—Systems for Signal, Image, and Video Technology, Klower Academic Publishers, pp. 273-291, Iss. 1-3, vol. 30, Mar. 2002.

T. Krauss, W. Hillery, and M. Zoltowski; "Downlink Specific Linear Equalization for Frequency Selective CDMA Cellular Systems;" Journal of VLSI Signal Processing—Special Issue on Signal Processing for Wireless Communications: Algorithms, Performance, and Architecture, Klower Academic Publishers, Vol. 30, Nos. 1-3, Jan.-Mar. 2002, pp. 143-162.

Turbo code: Information From Answers.com.

R. Koetter, A. Singer, and M. Tüchler; "Turbo Equalization;" IEEE Signal Processing Magazine; Jan. 2004; pp. 67-80.

J. Hagenauer; "Forward Error Correcting for CDMA Systems;" IEEE Intl. Supp. Spread Spectrum Tech. And Applications (ISSSTA); Sep. 22-25, 1996; pp. 566-569.

M. Tüchler, R. Koetter, and A. Singer; "Turbo Equalization: Principles and New Results;" IEEE Transactions on Communications, vol. 50, No. 5; May 2002; pp. 754-767.

X. Wang and H. Vincent Poor; "Iteractive (Turbo) Soft Interference Cancellation and Decoding for Coded CDMA;" IEEE Transactions on Communications, vol. 47, No. 7; Jul. 1999; pp. 1046-1061.

G. Bottomley, T. Ottosson, and Y. Wang; "A Generalized RAKE Receiver for Interference Suppression;" IEEE Journal on Selected Areas in Communications, vol. 18, No. 8; Aug. 2000; pp. 1536-1545.

Y. Wang, J. Cheng, S. Grant, and G. Bottomley; "MLSE and MAP Detectors for High-Data-Rate DS-CDMA Reception in Dispersive Channels;" IEEE; 2004; pp. 963-967.

C. Laot, A. Glavieux, and J. Labat; "Turbo Equalization: Adaptive Equalization and Channel Decoding Jointly Optimized;" IEEE Journal on Selected Areas in Communications, vol. 19, No. 9; Sep. 2001; pp. 1744-1752.

R. Kohno, H. Imai, and M. Hatori; "Design of Automatic Equalizer Including a Decoder of Error-Correcting Code;" IEEE Transactions on Communications, vol. Com-33, No. 10, Oct. 1985; pp. 1142-1146.

A. Chan and G. Wornell; "A Class of Block-Iterative Equalizers for Intersymbol Interference Channels: Fixed Channel Results;" IEEE Transactions on Communications, vol. 49, No. 11; Nov. 2001; pp. 1966-1976.

M. Tüchler, A. Singer, and R. Koetter; "Minimum Mean Squared Error Equalization Using a Priori Information;" IEEE Transactions on Signal Processing, vol. 50, No. 3; Mar. 2002; pp. 673-683.

H. Omori, T. Asai, and T. Matsumoto; "A Matched Filter Approximation for SC/MMSE Iterative Equalizers;" IEEE Communications Letters, vol. 5, No. 7; Jul. 2001; pp. 310-312.

M. Moher; "An Iteractive Multiuser Decoder for Near-Capacity Communications;" IEEE Transactions on Communications, vol. 46, No. 7; Jul. 1998; pp. 870-880.

M. Reed, C. Schlegel, P. Alexander, and J. Asenstorfer; Iteractive Multiuser Detection for CDMA with FEC: Near-Single-User Performance; IEEE Transactions on Communications, Vol. 46, No. 12; Dec. 1998; pp. 1693-1699.

D. Reynolds and X. Wang; "Turbo Multiuser Detection with Unknown Interferers;" IEEE Transactions on Communications, vol. 50, No. 4; Apr. 2002; pp. 616-622.

E. Hardouin and C. Laot; "Iteractive Channel Equalization for the Multicode DS-CDMA Downlink;" IEEE; 2003; pp. 1857-1861.

J. Rößler, L. Lampe, W. Gerstacker, and J. Huber; "Decision-Feedback Equalization for CDMA Downlink;" IEEE; 2002; VTC 2002; pp. 816-820.

G. Bottomley; "CDMA Downlink Interference Suppression Using I/Q Projection;" IEEE Transactions on Wireless Communications, vol. 2, No. 5; Sep. 2003; pp. 890-900.

U.S. Appl. No. 10/746,434, filed Dec. 24, 2003; Inventor: Cheng.

PCT International Search Report (5 pages).

PCT Written Opinion of the ISA (6 pages).

* cited by examiner

LINEAR TURBO EQUALIZATION USING DESPREAD VALUES

TECHNICAL FIELD

The technical field relates to communications, and more particularly, to demodulation in a direct sequence-code division multiple access (DS-CDMA) communications system.

BACKGROUND

Third generation cellular communications employ wideband CDMA (WCDMA). CDMA is a method for transmitting simultaneous signals over a shared portion of the spectrum. CDMA spreads the signal over the full bandwidth of the CDMA frequency band using a spreading code that, because it is orthogonal to all the other spreading codes used, allows each modulated bit stream to be distinguished (decoded) at the receiver from all of the other signals and noise. The rate of the spreading signal is known as the "chip rate," as each bit in the spreading signal is called a "chip", e.g., one bit from the modulated bit stream is spread into 128 chips, giving the receiver an enormous amount of data it can average to determine the value of one bit.

A Rake receiver structure is commonly used to recover information corresponding to one of the user data streams in CDMA receivers. In a typical Rake receiver, a received composite signal is correlated with a particular spreading sequence assigned to the receiver to produce a plurality of time-offset correlations, each one corresponding to an echo or image of a transmitted spread spectrum signal. The correlations are then combined in a weighted fashion, i.e., respective correlations are multiplied by respective weighting factors and then summed to produce transmitted symbol estimates that hopefully correspond to the originally transmitted symbols.

WCDMA has been evolving to support higher data rates over the radio interface. In the downlink from the radio access network to the mobile terminal, high speed downlink (base station-to-mobile station) packet access (HSDPA) may use multi-code transmission (i.e., more than one spreading code is used to send the information bit stream) and/or higher-order modulation to send more modem (modulated) bits per frame, thereby enabling higher rates. A major obstacle to achieving higher bit rates relates to the dispersive characteristics of a radio channel. If the channel is dispersive, self-interference results primarily due to loss of orthogonality between the multi-code signals. This form of self-interference is referred to as intercode interference (ICI). Another form of self-interference is interference from successive symbols on the same code. This interference is referred to as intersymbol interference (ISI). Higher-order modulation is particularly sensitive to self-interference. The story is similar in the uplink (mobile to base station). The "enhanced uplink" currently being standardized for WCDMA will use multi-code and low spreading factor to enable higher rates. At high rates, dispersion leads to significant self-interference.

FIG. 1 helps illustrate the self-interference problem. In this simple example, three symbols 1, 2, and 3 are sent sequentially on one spreading code while three other symbols 4, 5, and 6 are sent sequentially on a different spreading code. As a result, two symbols are sent in parallel during each symbol period. Due to time dispersion, the transmitted signal travels along two paths such that the second path has a longer delay than the first. As a result, the receiver receives two overlapping signal images corresponding to the two different path delays. Assume recovery of the image of symbol 2 (the symbol of interest) from the first path (identified with dots). While this symbol 2 image overlaps with the image of symbol 5 on path 1, there is no interference between these two images because spreading codes 1 and 2 are orthogonal and their correlation is substantially zero. But there is interference from path 2. Specifically, there is ISI from symbol 1 on the same code (shown with slanted lines) and ICI from symbols 4 and 5 (shown with horizontal lines). The overlapping portion of symbol 1 path 2 interferes when symbol 2 path 1 is despread. Overlapping portions of symbols 4 and 5 in path 2 are not aligned with symbol 2 path 1, so the desired orthogonality is lost.

There are different approaches to this self-interference problem. One is linear equalization to suppress self-interference. One linear equalization approach is to perform equalization despreading as part of Rake combining process using a generalized-Rake (G-Rake) receiver. Combining weights (vector w) are determined by net channel estimates (vector h) and an impairment covariance matrix estimate (R) by solving $$Rw = h. \qquad (1)$$

With code-specific G-Rake, the impairment covariance and/or the channel estimates can be determined based on a set of spreading sequences being used. Another linear equalization approach is chip equalization where chip samples are filtered prior to despreading to suppress interference. The main limitation with linear equalization is the limited amount of interference suppression. Loss of orthogonality is due to the channel. Linear equalizers try to undo the channel to restore orthogonality. But this enhances noise and other forms of interference. Thus, this trade-off prevents full restoration of orthogonality.

With nonlinear equalization, such as maximum likelihood sequence estimation (MLSE) and maximum a-posteriori probability (MAP) equalization, self interfering symbols are jointly detected. Thus, rather than undoing the channel, the receiver accounts for what the channel did to the signal. This avoids the noise enhancement problem. The drawback is much higher complexity relative to linear equalization. The receiver must maintain a state space whose size depends exponentially on how many symbols interfere with one another.

In CDMA system, interference cancellation has been proposed for improved demodulation. Modem symbols are detected and then used to remove their contribution to the received signal so that detection of other symbols is improved. But modem symbol detection is not always accurate. Thus, interference cancellation can actually worsen the situation when symbol detection errors are made. Also, such an approach does not utilize forward error correction (FEC) coding structure to obtain reliable modem symbol estimates.

Turbo-equalization is an approach in which equalization and FEC decoding are performed iteratively, each exchanging information with the other. It was originally developed for narrowband or nonspread systems and later applied to CDMA systems, primarily in conjunction with nonlinear equalization. Again, the problem is complexity. To reduce complexity in turbo-equalization, a linear equalizer can be used that performs chip-level equalization. A drawback with chip equalization is that it is complicated; it is easier to equalize the despread signal. Moreover, traditional CDMA receiver architectures initially despread the received signal and perform linear equalization after despreading.

SUMMARY

A linear turbo-equalizer for use in a CDMA receiver equalizes a despread received signal (rather than the spread received signal) to suppress self-interference resulting from coupling between transmitted symbols. This approach fits very well into existing CDMA radio receivers that employ traditional Rake receiver architectures and offers an alternative to chip equalization. In an example implementation, a linear equalizer based on a generalized-Rake (G-Rake) receiver design uses decoder feedback in forming Rake combining weights as well as in forming a self-interference estimate removed from the equalizer signal provided to the decoder. Preferably, turbo-decoding is also performed. Each turbo-decoder component decoder executes one pass and feeds back extrinsic information to the equalizer to prevent the decoder from locking onto an incorrect decoding result. An example application of this technology includes any type of radio receiver such as a mobile radio or a radio base station.

More generally, a method, an apparatus, and a program product are described for processing a received, direct-sequence code-division multiple-access (DS-CDMA) baseband signal to recover information bits. The DS-CDMA baseband signal includes composite noise and transmitted symbols, and each transmitted symbol includes one or more modulated bits. A first set of modulated bit estimates is formed based on the received signal. Decoding operations are performed using the first set of modulated bit estimates to produce extrinsic information associated with the modulated bits. The modulated bit estimates correspond to transmitted symbols sent in parallel on different spreading codes. For multiple delays of the received signal, a despreading operation is performed using the received baseband signal to produce multiple despread values corresponding to a transmitted symbol. A second set of modulated bit estimates is formed using the despread values and the extrinsic information. Decoding operations are performed using the second set of modulated bit estimates to produce information bit estimates.

The second set of modulated bit estimates is preferably performed by an enhanced linear equalizer. From the extrinsic information, the enhanced linear equalizer determines an interference estimate associated with a transmitted symbol. More specifically, the extrinsic information is used to form an average symbol value for an interfering transmitted symbol. The enhanced linear equalizer uses the average symbol value to form an interference estimate associated with the transmitted symbol. The equalizer removes the interference estimate from its output provided to the decoder.

As mentioned above, a non-limiting, example embodiment of the enhanced linear receiver employs a generalized-Rake (G-Rake) receiver using a second set of combining weights to form the first set of modulated bit estimates. The generalized-Rake receiver produces symbol estimates from despread values output from a Rake correlator, and the symbol estimates are used to produce modulated bit estimates. The enhanced linear equalizer includes an enhanced Rake "fingers" weight processor to form a first and second set of combining weights. The interference removal can be performed on the despread values from the Rake correlator before weighted combining or after weighted combining. In either approach, the first set of combining weights are determined based on the extrinsic information.

A symbol likelihood processor uses the extrinsic information to form symbol likelihoods corresponding to the transmitted symbols. The combining weights are determined based on the symbol likelihoods. A first set of combining weights may be used in forming the first set of modulated bit estimates. A second different set of combining weights, for use in forming the second set of modulated bit estimates, are determined based on channel estimates and an impairment covariance estimate.

Preferably, the decoder is a turbo-decoder. One turbo-decoding pass is performed with first and second component decoding operations using the modulated bit estimates to produce the extrinsic information. After the turbo-decoding one pass, the extrinsic information is preferably provided to the linear equalizer to form the second set of modulated bit estimates. Alternatively, multiple turbo-decoding passes can be performed before providing the extrinsic information to the linear equalizer, but with the risk of locking onto incorrectly decoded symbols and misleading the equalizer.

The turbo-decoder can use a serial approach where it performs a first component decoding operation using the modulated bit estimates to produce a first set of modulated bit likelihood information and a second component decoding operation using the modulated bit estimates and the first set of modulated bit likelihood information to produce a second set of modulated bit likelihood information (i.e., serial in the sense that the second set information depends on the first set information). From the first and second sets of modulated bit likelihood information, the turbo-decoder forms the extrinsic information. Alternatively, the turbo-decoder can use a parallel approach. It performs a first component decoding operation using the modulated bit estimates to produce a first partial set of modulated bit likelihood information and a second component decoding operation using the modulated bit estimates to produce a second partial set of modulated bit likelihood information. The turbo-decoder combines (i.e., in parallel) the first and second partial sets of modulated bit likelihood information to produce the extrinsic information.

DETAILED DESCRIPTION

In the following description, for purposes of explanation and non-limitation, specific details are set forth, such as particular nodes, functional entities, techniques, protocols, standards, etc. in order to provide an understanding of the described technology. It will be apparent to one skilled in the art that other embodiments may be practiced apart from the specific details disclosed below. In other instances, detailed descriptions of well-known methods, devices, techniques, etc. are omitted so as not to obscure the description with unnecessary detail. Individual function blocks are shown in the figures. Those skilled in the art will appreciate that the functions of those blocks may be implemented using individual hardware circuits, using software programs and data in conjunction with a suitably programmed microprocessor or general purpose computer, using applications specific integrated circuitry (ASIC), field programmable gate arrays, one or more digital signal processors (DSPs), etc.

In the text below, the terms modulated bit estimate and modem bit estimate are used interchangeably. The adjectives modulated and modem are not meant to be limiting but are used simply to distinguish the bits being processed/demodulated from the actual information bits that are ultimately output by the decoder. The term likelihood information or values includes any type of likelihood or probability parameter including for example probabilities, probability ratios, log probabilities, log-likelihood ratios, soft values, etc.

Figure 1:
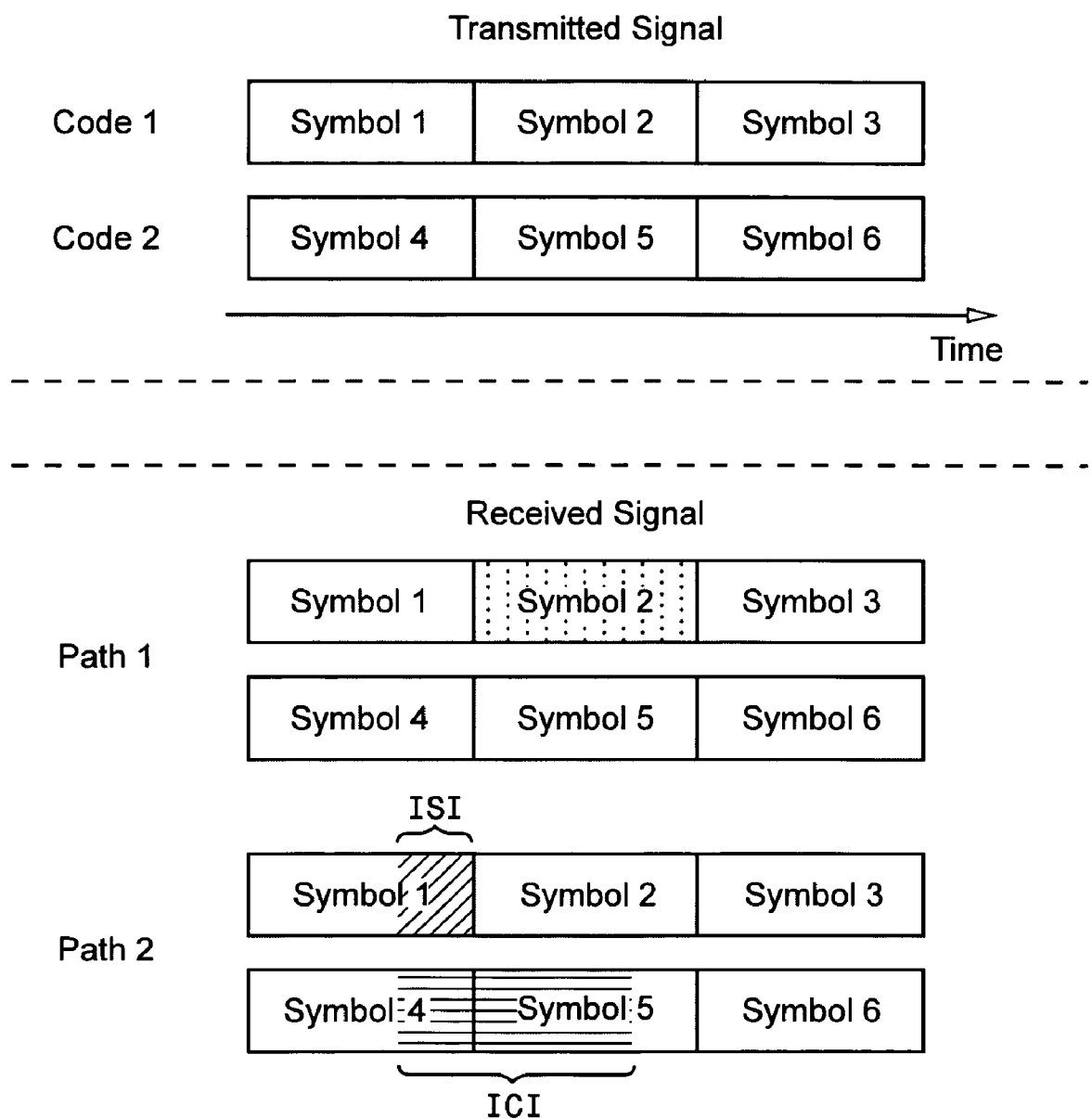
FIG. 1 is a diagram that illustrates examples of ISI and ICI self-interference.
Figure 2:
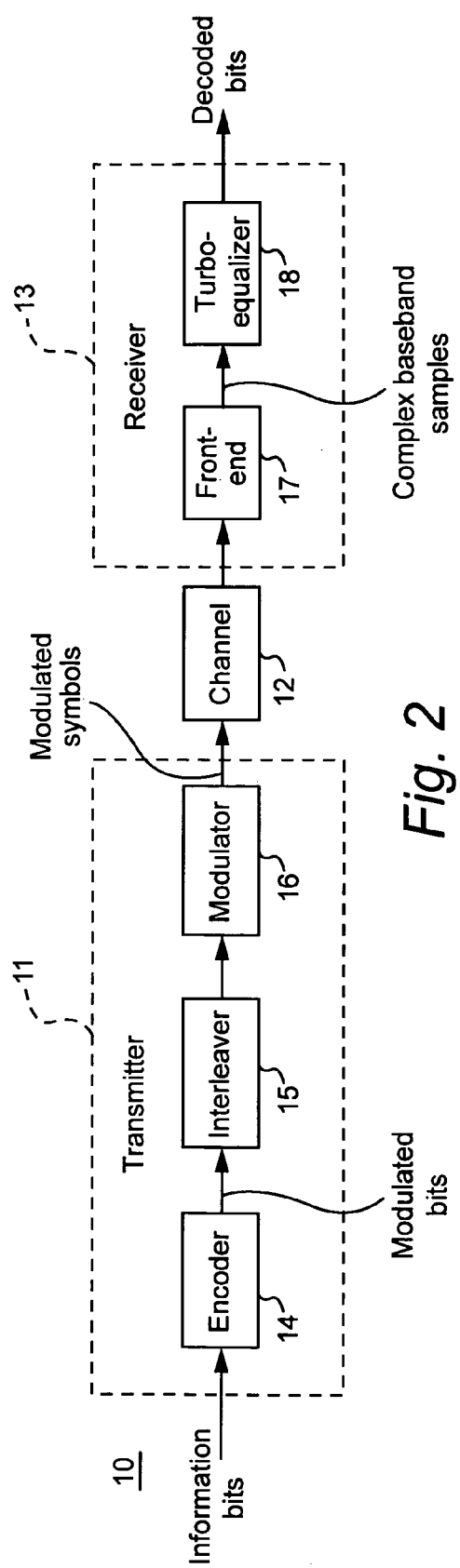
FIG. 2 is a diagram representing a link in a communications system.
Figure 3:
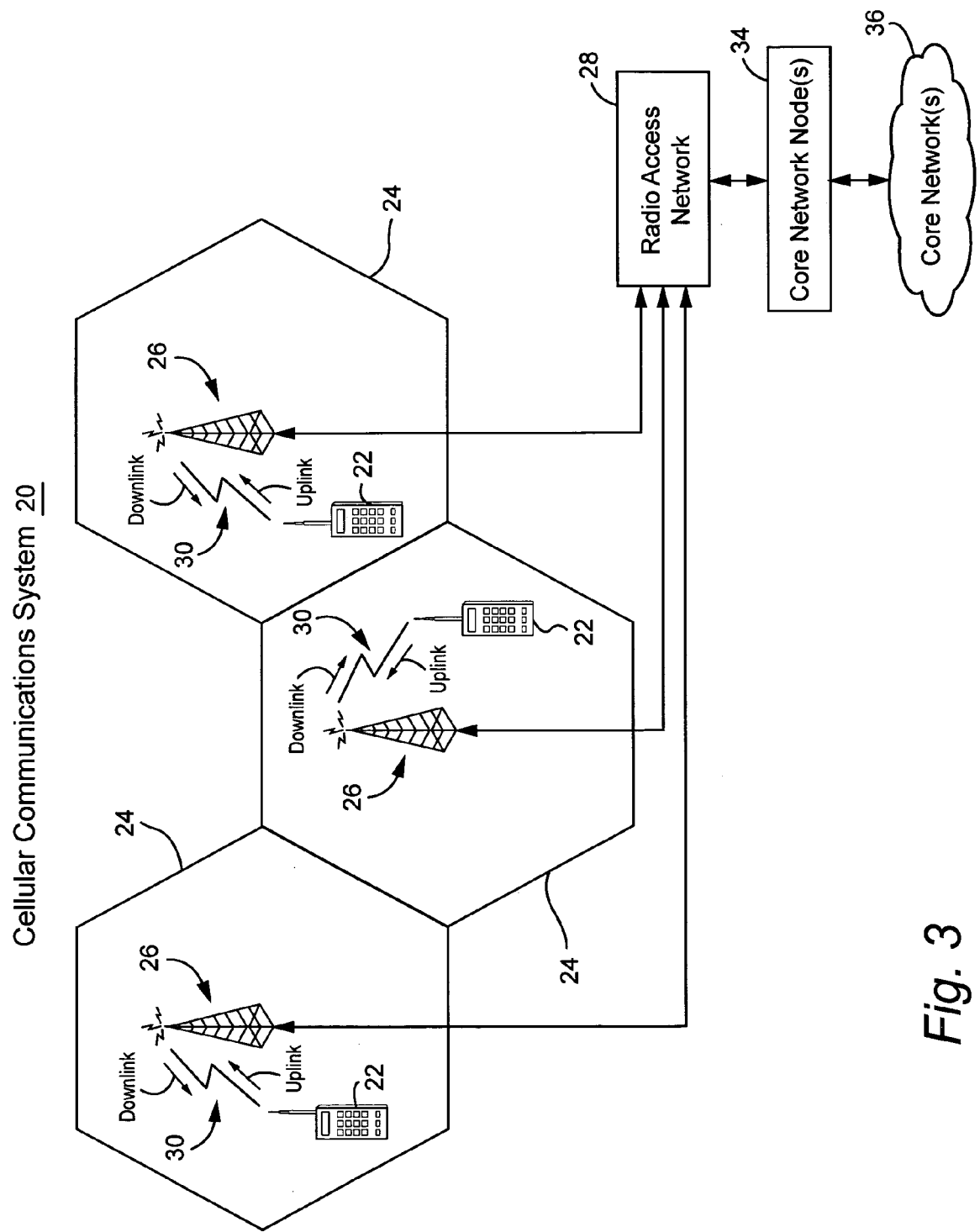
FIG. 3 is a diagram of an example cellular communications system.

A block diagram of a communications link between a transmitter and a receiver is shown in FIG. 2. One non-limiting example application is a radio communications system. An example cellular communications system 20 is shown in FIG. 3. One or more mobile radios (terminals) 22 communicate with cells 24 served by associated base stations 26 and a radio access network RAN 28 (the base stations are part of the RAN). The RAN 28 is coupled to one or more core network nodes 34, which in turn are connected to one or more respective core networks 36 (e.g, the PSTN, the Internet, etc.). Although only three cells 24 are shown, a typical cellular network may include hundreds of cells and may serve thousands of mobile radios. Although a terrestrial RAN is shown, a satellite based RAN could also be used.

The cells 24 generally serve as nodes in the communication system 20, from which links are established between the mobile radios 22 and the RAN 28, by way of the base stations 26 serving the cells 24. Each base station 26 handles radio communication between a cell 24 and mobile terminals 22. Both the base stations and the mobile stations include radio transceiving, signal, and data processing circuitry to transmit and receive cellular radio communications (voice and/or data) over the radio air interface. Transmissions from the base stations to the mobile station are referred to as downlink transmissions, and transmissions from the mobile station to the base station are referred to as uplink transmissions.

Third generation cellular systems typically use CDMA or WCDMA because CDMA systems achieve increased channel capacity by using "spread spectrum" techniques where a communications channel is defined by modulating a data-modulated carrier signal by a unique spreading code, i.e., a code that spreads an original data-modulated carrier over a wide portion of the frequency spectrum in which the communications system operates. Conventional spread-spectrum CDMA communications systems commonly use so-called "direct sequence" spread spectrum modulation. In direct sequence modulation, a data-modulated carrier is directly modulated by a spreading code or sequence before being amplified by a power amplifier and transmitted over a communications medium, e.g., a radio air interface. The spreading code includes a sequence of "chips" occurring at a chip rate that is much higher than the bit rate of the data being transmitted.

The transmitter 11 illustrated in FIG. 2 performs various signal processing steps including error correction coding, interleaving, and modulating functions. An information bit stream is encoded using an FEC encoder 14 (convolutional, turbo code, low-density parity-check (LDPC) code, etc.), and then interleaved in an interleaver 15 to produce a stream of encoded bits to be modulated (modulated bits) denoted $\{b_p; p=0, \ldots, N_e-1\}$. These encoded bits are then used to form a modulation symbol stream $\{S_i; i=0, \ldots, N_s-1\}$. An arbitrary, M-ary modulation is assumed, with symbol set $\{S_m; m=0, \ldots, M-1\}$. BPSK and QPSK modulation can be used as well as higher-order modulation such as 16-QAM. It is assumed that the encoded bits are sufficiently random so that all symbol values are equi-likely with probability 1/M. Modulation in block 16 includes spreading and mixing up to a radio carrier frequency. However, in the subsequent equations, a baseband equivalent signal is described.

For multi-code transmission (multiple codes are used to transmit a user's data), the modulation symbol stream is split into K parallel streams for parallel transmission. The i'-th symbol of the k'-th stream is given by $$s_{k'}(i') = s_i(k', i'), \quad (2)$$

where $$i(k', i') = k' + i'K. \quad (3)$$

The baseband transmitted signal can be expressed as $$x(t) = \sqrt{E_{k'(i)}} \sum_{k'=0}^{K-1} \sum_{i'=-\infty}^{\infty} s_{k'}(i') a_{k', i'}(t - i'T), \quad (4)$$

where K is the number of streams, $E_{k'(i)}$ is the energy-per-symbol, $s_{k'}(i')$ is the i'th symbol in stream k', $a_{k', i'}(t)$ is the spreading waveform for the i'th symbol in stream k', and T is the symbol period. The spreading waveform consists of an N-chip spreading sequence convolved with a chip pulse shape, which is assumed to be root-Nyquist. The spreading sequences are assumed to be orthogonal when time-aligned.

In (4), the transmitted signal is expressed in terms of a double summation, summing over streams as well as symbol periods. In later sections, it will be convenient to express this as a single summation, using index i, giving $$x(t) = \sum_{i=-\infty}^{\infty} \left(\sqrt{E_{k'(i)}}\right) s_i a_i (t - i'(i)T), \quad (5)$$

where $$k'(i) = i \bmod K \quad (6)$$

$$i'(i) = \lfloor i/K \rfloor. \quad (7)$$

The transmitted signal passes through a dispersive channel 12, modeled by an L-tap FIR filter with relative delays $\{\tau_l; l=0, \ldots, L-1\}$ and medium coefficients $\{g_l; l=0, \ldots, L-1\}$. The channel-filtered signal is received at receiver 13 in the presence of noise n(t), giving a received signal of the form $$r(t) = \sum_{l=0}^{L-1} g_l x(t - \tau_l) + n(t). \quad (8)$$

For a cellular system like that in FIG. 3, in the downlink, n(t) models other-cell interference in addition to thermal noise. In the uplink, it models other-user interference in addition to thermal noise.

The receiver 13 receives a composite signal, and a front-end processor 17 mixes the radio signal received on one or more receive antennas down to baseband digital samples that includes composite noise and transmitted symbols. The baseband samples are provided to a tubo-equalizer 18. Part of the turbo-equalizer 18 includes correlators or fingers, which despread symbols with a user's spreading code to produce despread values. Symbols are despread using J Rake fingers by correlating the received signal to the conjugate of the spreading waveform at delays $\{d_j, j=0, \ldots, J-1\}$. The vector of despread values for symbol $s_k$ can be represented as $$y_k = h_{k,k} s_k + u_k \quad (9)$$

$$u_k = \sum_{i \neq k} h_{i,k} s_i + n_k, \quad (10)$$

where $h_{i,k}$ is the overall channel response for symbol i as seen by despreading symbol k. It depends on the chip pulse shape, the channel response, and the aperiodic crosscorrelation between the spreading codes for symbols i and k. Setting k=0 ($s_o$ is the symbol of interest), the jth row of $h_{i,o}$ can be expressed as $$h_{i,0}(j) = \sum_{l=0}^{L-1} \tilde{g}_l R_{k'(i), i'(i)}(d_j - i'(i)T - \tau_l), \quad (11)$$

where $\tilde{g}_l = \sqrt{E_{k'(i)}} g_l$, $$R_{k,i}(t) = \frac{1}{N} \sum_{m=1-N}^{N-1} C_{k,i}(m) R_p(t + m T_c) \quad (12)$$

$$C_{k,i}(m) = \begin{cases} \sum_{n=0}^{N-1-m} c_{k,i}(n) c_{0,0}^*(n+m), & 0 \leq m \leq N-1 \\ \sum_{n=0}^{N-1+m} c_{k,i}(n-m) c_{0,0}^*(n), & 1-N \leq m < 0. \end{cases} \quad (13)$$

$$R_p(\tau) = \int_{-\infty}^{\infty} p(t+\tau) p * (\tau) d\tau, \quad (14)$$

and p(t) is the chip pulse shape. The term $c_{k,i}(n)$ is the spreading sequence for user k at symbol period i. The receiver knows the pulse shape and its autocorrelation $R_p(\tau)$ The pulse shape is normalized so that $R_p(0)=1$.

In (9), the first term $h_{k,k} s_k$ on the right hand side can be considered the "signal" term, whereas the second term, $u_k$, is the impairment (interference+noise). The noise vector $n_k$ is the result of despreading the composite noise. In (11), $\tilde{g}_l$ may be viewed as the channel coefficient, being the product of the medium coefficient and the square-root of the energy associated with the symbol. Conventional channel estimation may be used to estimate the channel coefficient. Returning to the cellular example, if the channel is estimated using a common pilot channel, the channel coefficient associated with the data can be obtained by an appropriate scaling, which in essence scales by the square-root of the ratio of the powers. In the uplink, the channel is usually estimated using a known signal on the control channel. In this case, the relative scaling for the data channel is known and can be used to scale the channel estimate from the control channel to obtain a channel estimate for the data channel. In (12), $R_{k,i}(t)$ may be viewed as the crosscorrelation of the spreading waveform for symbol k with the spreading waveform for symbol i.

Figure 4:
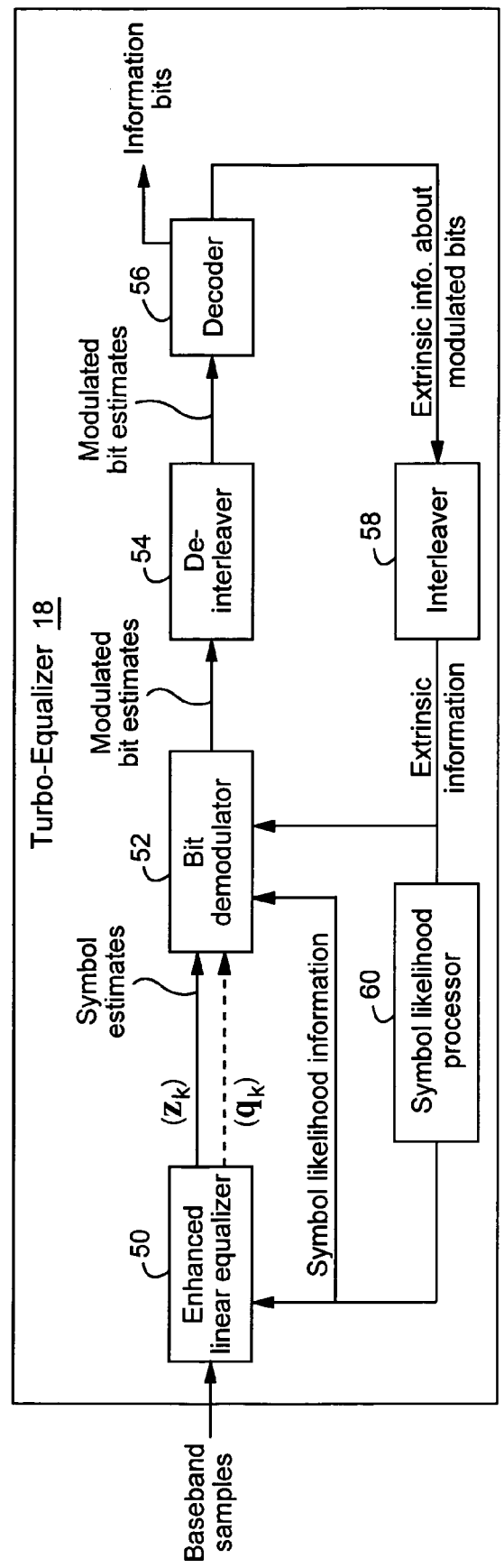
FIG. 4 is a function block diagram of one example embodiment of a turbo-equalizer.

A block diagram example of the turbo equalizer 18 is given in FIG. 4. Baseband received samples are provided to an enhanced linear equalizer 50, which produces symbol estimates $z_k$ and possibly $q_k$ estimates (used with higher-order modulation), depending on the modulation used. The symbol estimates are provided to a bit demodulator 52. The bit demodulator 52 also receives symbol likelihoods from a symbol likelihood processor 60 and extrinsic information from the decoder 56 after re-ordering by interleaver 58. The bit demodulator 52 uses these things to produce modulated bit estimates, which are provided to the de-interleaver 54. The de-interleaver 54 de-interleaves (re-orders) the modulated bit estimates, in essence undoing the interleaving done at the transmitter. The de-interleaved information is provided to the decoder 56. The decoder 56 produces decoded information bits for final output and further higher level processing as well as information regarding the modulated bits. This information is adjusted by the input modulated bit estimates to form extrinsic information associated with the modulated bits. The extrinsic information from the decoder 56 is interleaved by the interleaver 58 to produce interleaved extrinsic information which is provided to a symbol likelihood processor 60 as well as the bit demodulator 52. The symbol likelihood processor 60 uses the extrinsic information to produce symbol likelihood information.

The symbol likelihood processor 60 uses modulated bit extrinsic information from the decoder 56 to provide modulated symbol likelihood information, which is treated as prior or side information by the equalizer. Consider a particular symbol $s_k$, which represents a set of bits $\{b_o, b_l, \ldots, b_q\}$ where $q = \log_2(M) - 1$. Using all the feedback information from the decoder 56, the symbol likelihood is given by $$Pr(s_k = S_m) = Pr(b_o = B_o, \ldots, b_q = B_q), \quad (15)$$

where the modulated bit values $B_0$ through $B_q$ correspond to sending modulation symbol $S_m$. Observe that (15) requires joint likelihoods associated with a subset of bits that form a symbol. With symbol interleaving, such information may be available. With bit interleaving, it is reasonable to assume that the bits are unrelated, so that we can approximate (15) with $$Pr(s_k = S_m) \approx Pr(b_o = B_o) \times \ldots \times Pr(b_q = B_q). \quad (16)$$

The decoder 56 feeds back extrinsic information about the modulated bits, which are treated as prior log-likelihood ratios for each bit, i.e., $$V_d(b_j) = \log \frac{Pr(b_j = 0)}{Pr(b_j = 1)}, \quad (17)$$

where subscript "d" denotes a decoder 56 output. These can be converted into bit likelihoods using $$Pr(b_j = 0) = \frac{e^{V(b_j)}}{1 + e^{V(b_j)}} \quad (18)$$
$$= \frac{1}{1 + e^{-V(b_j)}}$$
$$= 1 - Pr(b_j = 1)$$

$$Pr(b_j = 1) = \frac{e^{-V(b_j)}}{1 + e^{-V(b_j)}} \quad (19)$$
$$= \frac{1}{1 + e^{V(b_j)}}$$
$$= 1 - Pr(b_j = 0).$$

Figure 5:
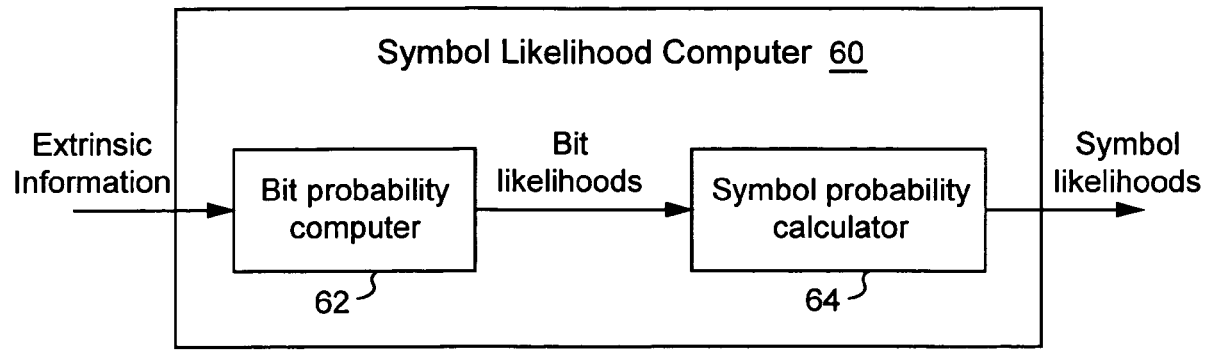
FIG. 5 is a function block diagram of a symbol likelihood computer shown in the turbo-equalizer of FIG. 4.

A block diagram of the symbol likelihood processor 60 is given in FIG. 5. Extrinsic information from the FEC decoder 56 is used by the bit probability computer 62 to compute bit probabilities as described in equations (18) and (19). These bit probabilities are provided to the symbol likelihood calculator 64, which computes symbol likelihood information as described by equation (16).

From (10), the mean, correlation, and covariance of the impairment are given by $$\bar{u}_k = \sum_{i \neq k} h_{i,k} \bar{s}_i \quad (20)$$

$$R_k = \sum_{i \neq k} \sum_{m \neq k} \overline{s_i s_m^*} h_{i,k} h_{m,k}^H + C_n \quad (21)$$

$$C_k = R_k - \bar{u}_k \bar{u}_k^H, \quad (22)$$

where $C_n$ denotes the covariance of composite noise process $n_k$ in (10). The element of this matrix corresponding to finger delays $d_1$ and $d_2$ is given by $$C_n(d_1, d_2) = \frac{N_0}{N} \sum_{m=1-N}^{N-1} C_{0,0}(m) R_p(d_1 - d_2 + mT_c), \quad (23)$$

where $C_{i,k}(m)$ is defined in (13). The term $\bar{s}_i$ denotes the mean symbol value, which can be expressed as $$\bar{s}_i = \sum_{m=0}^{M-1} Pr(s_i = S_m) S_m, \quad (24)$$

where $Pr(S_i = S_m)$ is provided by the symbol likelihood computer. The term $\overline{s_i s_m^*}$ is the average of the product of one symbol with the conjugate of another and depends on the joint probability of these symbols. If joint probability information is available, it can be used to determine $\overline{s_i s_m^*}$.

Typically, joint probability information is not available. However, due to interleaving, it is reasonable to assume the symbols are independent, so that $$\overline{s_i s_m^*} = \begin{cases} \bar{s}_i \bar{s}_m^* & m \neq i \\ \overline{|s_i|^2} & m = i \end{cases}, \quad (25)$$

where $$\overline{|s_i|^2} = \sum_{m=0}^{M-1} Pr(s_i = S_m)|S_m|^2. \quad (26)$$

With this assumption, (21) becomes $$R_k = \sum_{i \neq k} \overline{|s_i|^2} h_{i,k} h_{i,k}^H + \sum_{i \neq k} \sum_{m \neq k, m \neq i} \bar{s}_i \bar{s}_m^* h_{i,k} h_{m,k}^H + C_n. \quad (27)$$

Substituting (20) and (27) into (22) gives $$C_k = \sum_{i \neq k} (\overline{|s_i|^2} - |\bar{s}_i|^2) h_{i,k} h_{i,k}^H + C_n. \quad (28)$$

With traditional demodulation, all symbol values are assumed equi-likely. With symmetric signal constellations, this results in $\bar{s}_i = 0$. However, with turbo equalization, the decoder can provide side information about symbol likelihoods, which can be treated as prior information. In this situation, $\bar{s}_i$ can be non-zero. With enhanced linear equalization, symbol log-likelihoods are formed for a particular symbol $s_k$, treating information from the decoding unit as prior information about the interfering symbols $\{s_i; i \neq k\}$. Decoder information regarding $s_k$ is not included to avoid "double counting" such information when feeding the output of the linear equalizer 50 to the decoder 56.

Specifically, the enhanced linear equalizer 50 forms symbol estimates $z_k$ and $q_k$ estimates given by $$z_k = w_k^H \tilde{y}_k \quad (29)$$

$$q_k = w_k^H h_{k,k} \quad (30)$$

where $$\tilde{y}_k = y_k - \bar{u}_k \quad (31)$$

$$w_k = C_k^{-1} h_{k,k}. \quad (32)$$

In (31), an interference estimate $\bar{u}_k$ is subtracted from the traffic despread values to form modified traffic despread values. These modified traffic despread values are then combined in (29) to form the symbol estimate.

The vector of combining weights $w_k$ in (29) depends on an impairment covariance matrix and a channel response. The impairment covariance and channel response depend on the spreading codes being used. In addition, the impairment covariance matrix depends on symbol mean and mean-square values (see (28)), which depend on the decoder 56 feedback regarding the interfering symbols (see (24) and (26)).

The subtraction of $\bar{u}_k$ in (31) may be interpreted as a form of "soft interference cancellation." Extrinsic information feedback from the decoder 56 unit is used to determine mean symbol values, which are then subtracted from the equalizer's output to the decoder 56.

Figure 6:
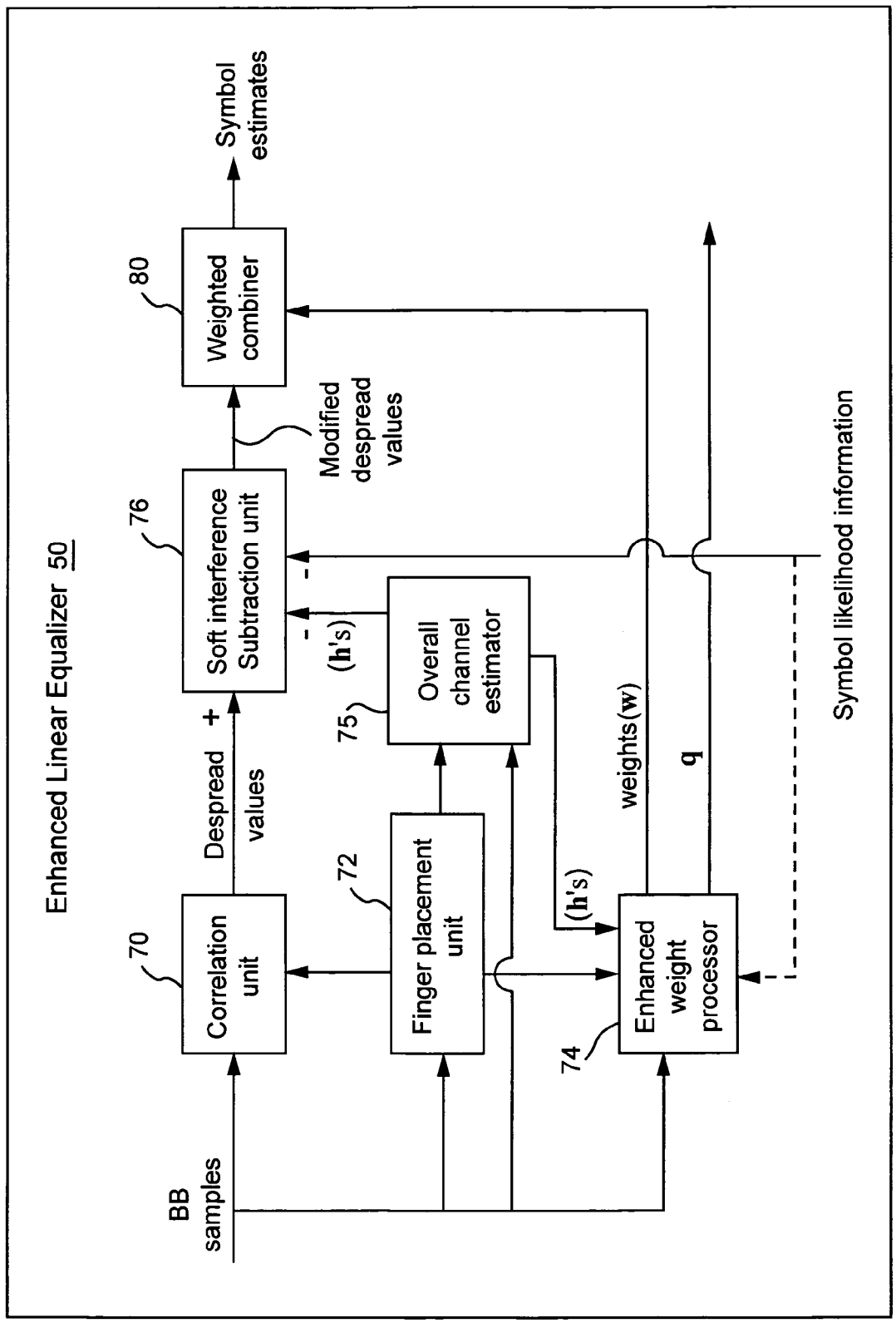
FIG. 6 is a function block diagram of an enhanced linear equalizer shown in the turbo-equalizer of FIG. 4.

A block diagram of one example implementation of the enhanced linear equalizer is shown in FIG. 6 which includes a generalized Rake receiver. Baseband samples are provided to a finger placement unit 72 which determines where to place Rake fingers in delay based on signal delays and delays useful for interference suppression. These delays determine how to despread the data in the correlation unit 70. An enhanced weight processor 74 computes combining weights (w) for the delays determined by the finger placement unit 72 using the received samples and overall channel estimates (h's) from an overall channel estimator 75. A correlation unit 70 despreads the baseband samples for the delays provided by the finger placement unit. Ultimately, the despread values are combined in a weighted combiner 80 using the combining weights provided by the enhanced weight processor 74 to produce symbol estimates.

The enhanced weight processor 74 computes the combining weights for each symbol period and each iteration or pass of the turbo-equalizer according to (32). Symbol likelihood information is also used by weight processor 74 to determine average symbol products according to (26) and (25). These are then used to determine an impairment covariance according to (28). The weight processor 74 also computes an estimate according to (30) if needed.

The despread values are provided to a soft interference subtraction unit 76. The subtraction unit 76 determines average symbol values according to (24). These average symbol values are scaled by an overall channel estimate (h's) provided by the overall channel estimator 75 (see (20)) and subtracted from the despread value according to (31) to form modified despread values. Depending on the form of the values, a different type of operation other than subtraction might be performed to remove the average symbol values. The main point is unit 76 removes the soft interference from the despread values. The modified despread values are combined in a weighted combiner 80 using the combining weights to produce a symbol estimate.

Soft interference subtraction/removal can be performed before combining as shown in FIG. 6. As these operations are linear, subtraction may be performed after combining. To do this, the soft intererence estimate would be combined first using the combining weights from weight processor 74 to form a combined interference estimate. The despread values from correlation unit 70 would be directly combined in weighted combiner 80 to produce an initial symbol estimate. A final symbol estimate would be generated by subtracting the combined interference estimate from the initial symbol estimate.

Figure 7:
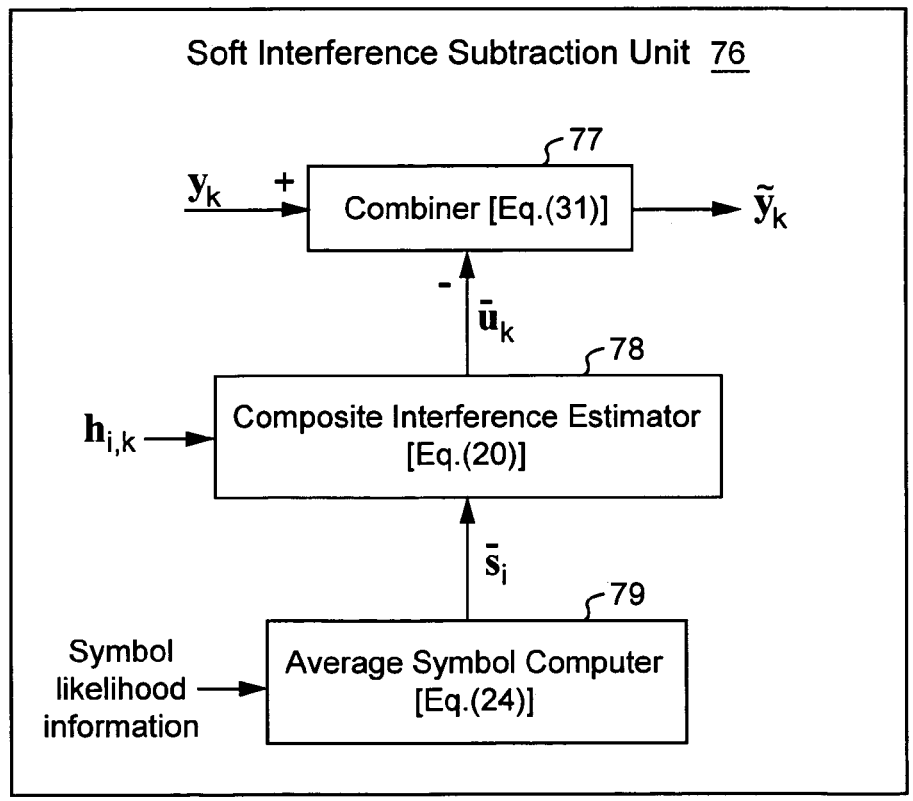
FIG. 7 is a function block diagram of a soft interference subtraction unit shown in the turbo-equalizer of FIG. 4.

Further details of the soft interference subtraction unit 76 are described now in conjunction with the function block diagram shown in FIG. 7. A combiner unit 77 receives despread values $y_k$ from the correlation unit 70. The combiner 77, in accordance with (31), subtracts the interference estimate $\bar{u}_k$ to produce modified despread values $\hat{y}_k$. To calculate the interference estimate, an average symbol computer 79 computes a mean symbol value $\bar{s}_i$ in accordance with equation (24) using symbol likelihood information. The mean symbol value is provided to a composite interference estimator 78 which also receives the overall channel estimates $h_{i,k}$ and generates the interference estimate $\bar{u}_k$ in accordance with equation (20).

Figure 8:
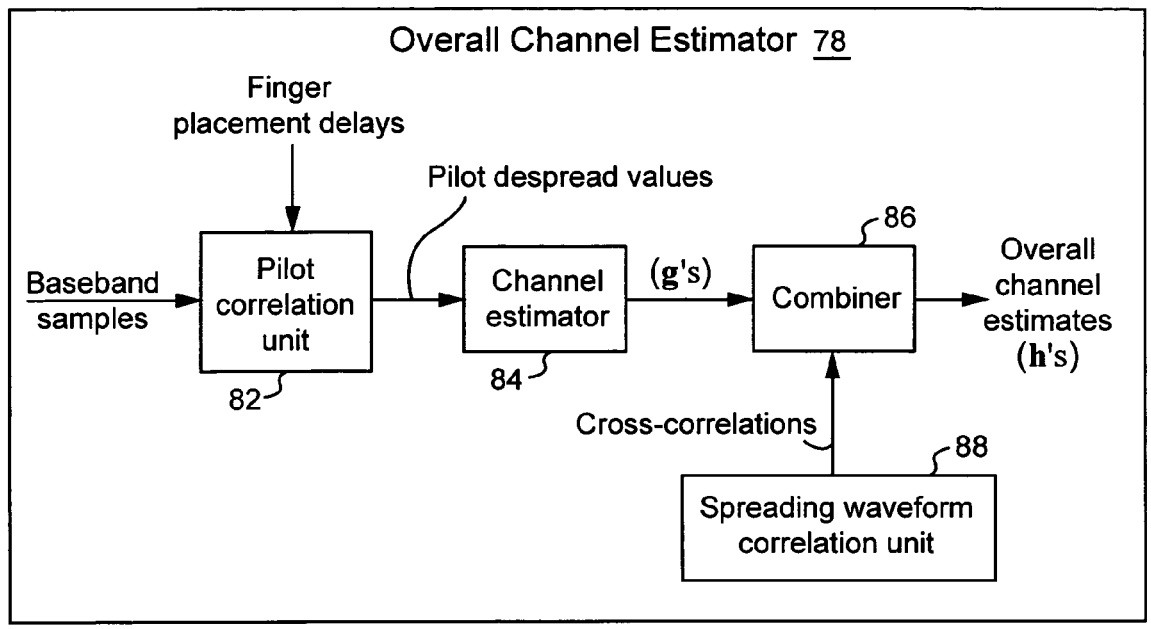
FIG. 8 is a function block diagram of an overall channel estimator shown in the turbo-equalizer of FIG. 4.

Both the enhanced weight processor 74 and the subtraction unit 76 rely on overall channel estimates, denoted $h_{i,k}$. A block diagram of the overall channel estimator 75 is shown in FIG. 8. Baseband samples are despread in the pilot correlation unit 82. These pilot despread values are used by the channel estimator 84 to form channel estimates, in essence $\tilde{g}_l$ values. In a combiner 86, these g values are combined with spreading waveform correlation values to produce overall channel estimates (h's) as described in equation (11). The spreading waveform correlation unit 88 determines spreading waveform correlations $R_{i,k}(t)$ at various lags t. These correspond to auto-correlation values if the spreading waveform is correlated with itself. Otherwise, they are cross-correlation values. The same channel estimates can be stored and reused to compute multiple correlation values. If the number of possible spreading codes is small enough, the correlation values can be precomputed and stored in a table.

To reduce complexity, certain approximations may be made that do not impact performance significantly. One approximation is to simplify the combining weight formation. From (32), code cross-correlations are needed to form $C_k$, and code auto-correlations are needed to form $h_{k,k}$. One approximation is to average one or both of these quantities over the random scrambling used in most systems.

First, consider averaging $h_{k,k}$ over the random scrambling. This simplifies the operation of the overall channel estimator when $h_{k,k}$ is computed ($h_{i,k}$ would still be computed as described earlier for the subtraction unit). From (11), assuming k=0, the jth row of $h_{o,o}$ becomes $$h_{0,0}(j) \approx \bar{h}_{0,0}(j) = \sum_{l=0}^{L-1} \tilde{g}_l R_p(d_j - \tau_l). \tag{33}$$

Thus, with respect to FIG. 8, the spreading waveform correlation unit 88 would compute average autocorrelation values for the spreading waveform which are simply pulse shape autocorrelation values that can be precomputed and stored.

Next, consider averaging $C_k$ over the random scrambling. In (28), the $j_1$th row and $j_2$th column of term $h_{i,k}h_{l,k}^H$ is replaced by $$E\{h_{i,0}(j_1)h_{i,0}(j_2)^*\} = \begin{cases} \sum_{l=0}^{L-1}\sum_{q=0}^{L-1} \tilde{g}_l \tilde{g}_q^* X_1(l,q), & i'(i) \neq 0 \\ \sum_{l=0}^{L-1}\sum_{q=0}^{L-1} \tilde{g}_l \tilde{g}_q X_2(l,q), & i'(i) = 0 \end{cases}, \tag{34}$$

where $$X_1(l,q) = \sum_{m=1-N}^{N-1} \left(\frac{N-|m|}{N^2}\right) R_p(t_1 + mT_c) R_p^*(t_2 + mT_c) \tag{35}$$

$$X_2(l,q) = \sum_{m=1-N,m\neq 0}^{N-1} \left(\frac{N-|m|}{N^2}\right) R_p(t_1 + mT_c) R_p^*(t_2 + mT_c) \tag{36}$$

$$t_1 = d_{j_1} - i'(i)T - \tau_l \tag{37}$$

$$t_2 = d_{j_2} - i'(i)T - \tau_q. \tag{38}$$

The symbols can be divided into groups (same symbol period or i'(i) value, different multi-code), which will have the same average outer product term.

When using (33), one is effectively ignoring interference of the symbol with itself, due to imperfect autocorrelation of the spreading waveform. This term can be treated as additional, colored noise. Setting i to zero in (11) gives $$h_{0,0}(j) = \sum_{l=0}^{L-1} \tilde{g}_l R_{0,0}(d_j - \tau_l), \quad (39)$$

Substituting (12) into (39) and using (33) gives $$h_{0,0}(j) = \frac{1}{N} \sum_{l=0}^{L-1} \tilde{g}_l \sum_{m=1-N}^{N-1} C_{k,1}(m) R_p(d_j - \tau_l + mT_c) \quad (40)$$

$$= \bar{h}_{0,0}(j) + \tilde{h}_{0,0}(j)$$

where $$\tilde{h}_{0,0}(j) = \frac{1}{N} \sum_{l=0}^{L-1} \tilde{g}_l \sum_{m=1-N, m\neq 0}^{N-1} C_{k,l}(m) R_p(d_j - \tau_l + mT_c) \quad (41)$$

Substituting (40) in (9) gives rise to an additional impairment term $\tilde{h}_{0,0}(j)s_0$, which can be treated as additional, colored noise (folded into $C_n$). An expression for the covariance due to this term is given by:

$$R_{SI}(d_1, d_2) = E\{|s_0(0)|^2 h_2(d_1) h_2^*(d_2)\} \quad (42)$$

$$= \frac{1}{N^2} \sum_{l=0}^{L-1} \sum_{q=0}^{L-1} \tilde{g}_l \tilde{g}_q^* \sum_{m=1-N,m\neq 0}^{N-1} (N - |m|) \times$$

$$R_p(d_1 + mT_c - iT - \tau_l) R_p^*(d_2 + mT_c - iT - \tau_q).$$

A further approximation is to simply express $C_k$ as the sum of an interference term and a noise term using standard G-Rake expressions. An additional, iteration-dependent scaling term can be introduced in front of the interference term that is set to 1 for the first pass, then gradually decreases as feedback from the decoder 56 becomes more confident. This gives $$C_k = C = q(o)C_1 + C_n, \quad (43)$$

where $q(o)$ is the scaling term for iteration o. With more confidence in the estimation of the interference cancellation term, the remaining uncertainty decreases. $C_1$ and $C_n$ may include adaptively-learned scaling factors $\alpha$ and $\beta$.

A scaling term can be set to the difference between the mean square value of the modulated symbols assuming equiprobably symbols and the square of the mean value of the modulated symbols based on the symbol likelihoods determined from the decoder. When the decoder is 100% certain of the symbol values, then this difference becomes zero, assuming all possible modulated symbol values appear equally often in the transmitted block. A similar approach may be derived by replacing $(|s_i|^2 - \bar{s}_i|^2)$ with an average value, averaged over i. Assuming $N_s$ symbols, the scaling term becomes $$q(o) = \frac{1}{N_s} \sum_{i=0}^{N_s-1} (\overline{|s_i|^2} - |\bar{s}_i|^2), \quad (44)$$

where the probabilities used to generate $\overline{|s_i|^2}$ and $\bar{s}_i$ are taken from iteration o−1.

The scaling term may be simplified to unity for the first pass and zero for the second pass. Alternatively, a fixed table of terms as a function of iteration can be used (e.g., 1, 0.8, 0.5). It may also be acceptable to leave the scaling term as unity for all passes. In any case, feedback from the decoder 50 is then only used for soft interference subtraction. Also, if only one or two weight vectors are considered, these can be applied separately to the data and interference cancellation term. While the latter must be performed each iteration, the first can be stored and reused.

Other approximations may also be used. For example, an M-algorithm approach may be used to avoid computing all conditional likelihoods. In the first pass, there is no decoder feedback. In this case, it is reasonable to assume equilikely symbol values. In addition, if the modulation scheme is symmetric in the complex plane, then $\bar{s}_i = 0$. This simplifies the mean and covariance of the impairment to $$\bar{u}_k = 0 \quad (45)$$

$$C_k = \sum_{l \neq k} h_{l,k} h_{l,k}^H + C_n. \quad (46)$$

The equalizer becomes a code-specific G-Rake in this case. Other forms of first pass demodulation can be used, such as conventional G-Rake reception or chip equalization. The bit demodulator 52 takes the symbol and $q_k$ estimates from the enhanced linear equalizer 50, symbol likelihood information from the symbol likelihood processor 60, and extrinsic information from the decoder 56 and produces soft modulated bit estimates. A Log-MAP approach is a preferred example approach.

For a particular bit $b_i$, in the set of bits that $s_k$ represents, we can divide the possible symbol values into two sets, set $Q_0(i)$ corresponding the ith bit being 0 (+1) and $Q_1(i)$ corresponding the ith bit being 1 (−1). Then, the likelihood ratio for that bit is given by $$LR(b_i) = \frac{\sum_{m \in Q_0(i)} \exp[U_{m,k}] Pr(s_k = S_m)}{\sum_{m \in Q_1(i)} \exp[U_{m,k}] Pr(s_k = S_m)}, \quad (47)$$

where $$U_{m,k} = 2\text{Re}\{S_m^* z_k\} - |S_m|^2 q_k \quad (48)$$

is a symbol metric.

The term $Pr(s_k = S_m)$ in (47) is computed from the feedback concerning the bits that comprise $s_k$ as described earlier. All the feedback information is used in computing this term. An adjustment is made in bit demodulator 52 so that double counting is avoided in second and subsequent passes. Also, it is more convenient for the bit estimate to be given in log form. Taking the log of (47), including the adjustment, and adding index o to clarify iteration number gives $$V_e(b_1, o) = \log\left(\sum_{m \in Q_0(i)} \exp[U_{m,k}] Pr(s_k = S_m)\right) - \quad (49)$$

$$\log\left(\sum_{m \in Q_1(i)} \exp[U_{m,k}] Pr(s_k = S_m)\right) - V_d(b_1, o-1),$$

where subscript "e" denotes information based on the equalizer output.

If desired, a dual max approximation may be used to approximate (49) as $$V_e(b_i, o) \approx \max_{m \in Q_0(i)} \{U_{m,k} + \log [Pr(s_k = S_m)]\} - \max_{m \in Q_1(i)} \{U_{m,k} + \log [Pr(s_k = S_m)]\} - V_d(b_i, o-1). \quad (50)$$

Other standard approaches can also be used.

Figure 9:
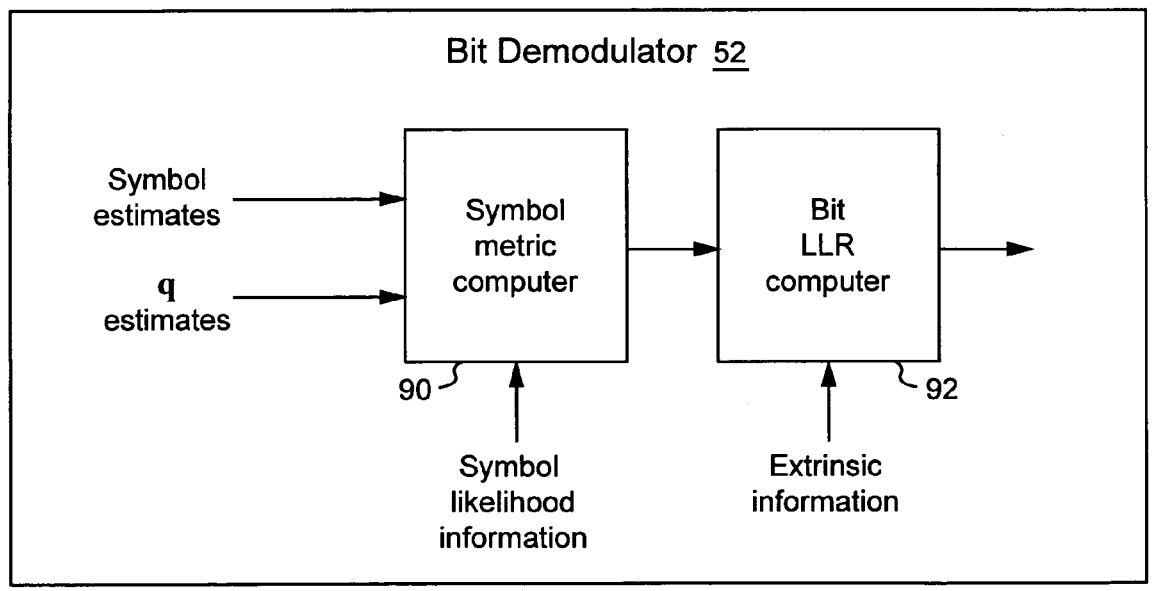
FIG. 9 is a function block diagram of a bit demodulator shown in the turbo-equalizer of FIG. 4.

A block diagram of the bit demodulator 52 is shown in FIG. 9. Symbol estimates and $q_k$ estimates are provided from the enhanced linear equalizer 50. A symbol metric computer 90 uses these inputs to form symbol metrics as described in equation (48). These symbol metrics are provided to a bit log-likelihood ratio (LLR) computer 92. Extrinsic information from the decoder 56 is also provided to the bit LLR computer 92. The bit LLR computer 92 uses these inputs to produce modulated bit estimates as described in (49) or (50).

With QPSK modulation, the second term in (48) becomes hypothesis independent. Omitting this term gives $$U_{m,k} = 2\text{Re}\{S^*_m z_k\} \quad (51)$$

The LLR for the in-phase (I) bit can be shown to be $$\text{LLR}(b_I) = 4Re\{z_k\}. \quad (52)$$

Similarly, the quadrature (Q) bit can be recovered by taking the imaginary part, rather than the real part, in (52). The factor "4" is a fixed scaling that can be omitted in (52) for decoders insensitive to a common scaling factor, which is usually the case. In this case, the bit demodulator can be much simpler. Input from the symbol likelihood processor 60 and input from the decoder 56 are not needed. Also, the symbol metric computer 90 is not required. The bit LLR computer 92 can simply use the symbol estimates from the enhanced linear equalizer 50 to compute bit estimates according to (52) and its counterpart for the Q bit.

One way to address BPSK is to treat it as QPSK and just recover the in-phase bit. This assumes that the impairment is circular. When the number of symbols that significantly contribute to ISI is small, this may not be a good approximation. In that case, the impairment can be treated as non-circular, and the in-phase and quadrature receive components are treated as separate, real input signals. With higher-order modulation, there is often symmetries that can be used to simplify symbol likelihood calculation and other operations. See, for example, commonly-assigned U.S. patent application Ser. No. 10/746,434 entitled, "Fast soft value computation methods for Gray-mapped QAM," filed Dec. 24, 2003, incorporated here by reference.

With traditional MAP or MLSE decoding, the soft bits provided by the demodulator are used to determine the information bit likelihoods or information sequence likelihoods. With turbo equalization, the decoder 56 must also generate likelihood ratios associated with the modulated bits. An adjustment occurs, so that the input soft values are subtracted from the modulated bit log-likelihood ratios generated by the decoder to capture only the information learned from the decoding process. The resulting extrinsic information is then fed back to the demodulation process. Such a decoder can be designed for a variety of codes, including turbo codes, LDPC codes and convolutional codes. There is added complexity to compute the modulated bit log-likelihood ratios. When the decoder 56 is a turbo-decoder or LDPC decoder, it may be important how many iterations ("passes") of turbo-decoding are performed before feeding back information to the equalizer. The preferred approach is to run each constituent decoder through only one pass, although multiples passes may be used. This prevents the decoder from locking onto an incorrect solution too early in the turbo-equalization process.

Figure 10:
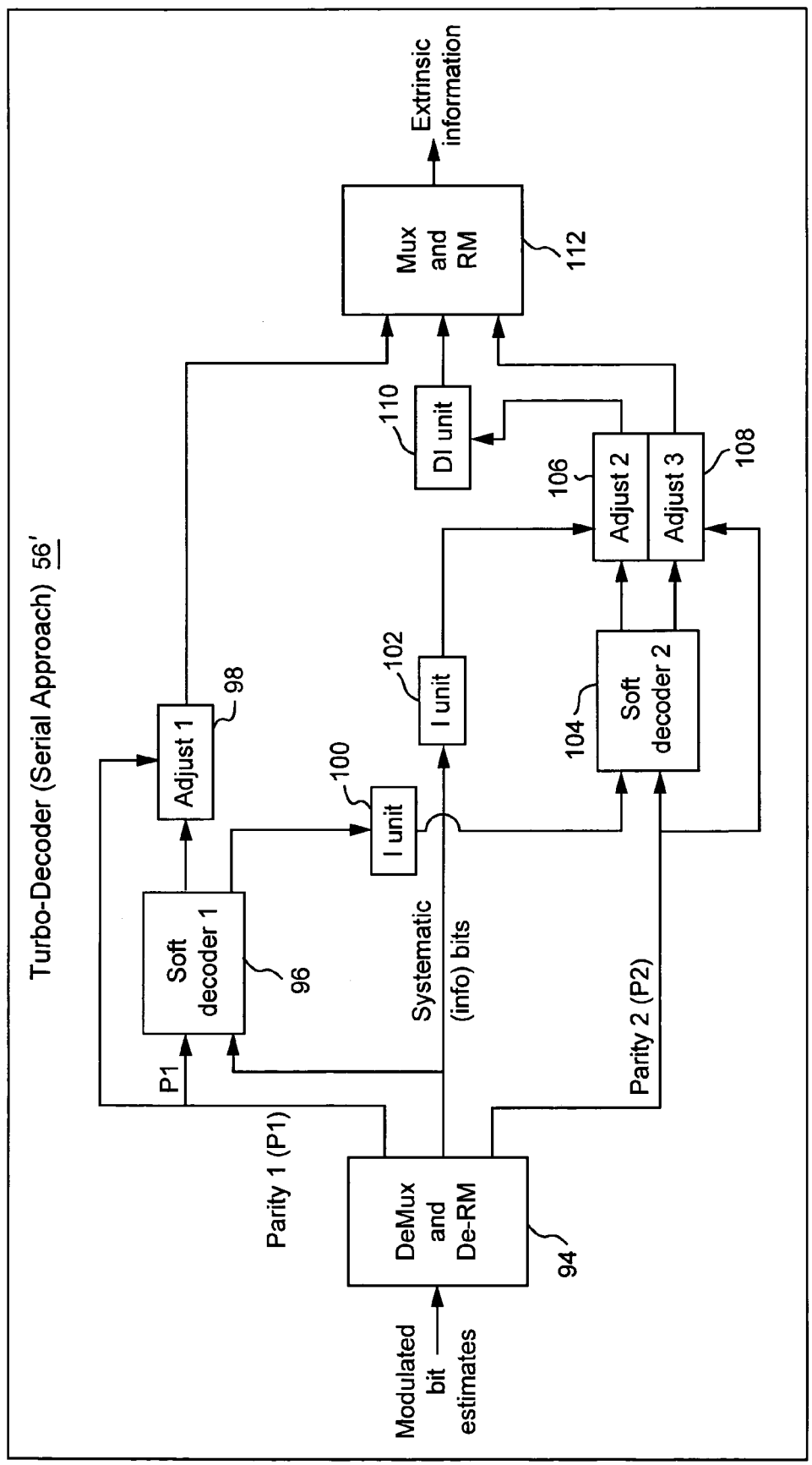
FIG. 10 is a function block diagram of an example turbo-decoder employing a serial approach that may be used as the decoder in the turbo-equalizer of FIG. 4.

Example embodiments where the decoder 56 is a turbo-decoder are now presented. A first example embodiment of a turbo-decoder 56' shown in FIG. 10 uses a serial approach to component code decoding. De-interleaved modulated bit estimates from the de-interleaver (DI) 54 are provided to a demultiplexing and de-rate-matching unit 94. Unit 94 splits the bit estimates into three streams corresponding to the systematic (the information bits), parity 1 (P1) and parity 2 (P2) streams of the turbo encoder in the transmitter 11. De-rate-matching is also performed, which involves depuncturing and/or de-repeating (combining repeats).

The systematic bits and the parity 1 bits are provided to a first soft decoder 1 (96), which performs decoding on component 1 of the turbo code. Soft decoder 1 produces likelihood information concerning the modulated bit estimates using standard approaches. The parity 1 likelihood values associated with the P1 bits are adjusted in adjust unit 1 (98) to produce extrinsic information for the parity 1 bits. For example, when quantities are expressed in terms of log-likelihood ratios, then the adjust unit 98 subtracts the parity 1 inputs to the decoder 56' from the corresponding parity 1 outputs of the decoder 96 to produce the extrinsic values.

The likelihood information corresponding to the systematic bits is provided to an interleave unit (I unit) 100, which interleaves the bits according to the transmission interleaving scheme to produce interleaved soft systematic bit values. These values, along with parity 2 values, are provided to a soft decoder 2 (104). Soft decoder 2 performs decoding on component 2 of the turbo code and produces soft information concerning modulated bits. These values are adjusted in adjust unit 2 (106) and adjust unit 3 to produce extrinsic information for both the systematic and parity 2 bits, respectively. The output systematic bits are adjusted by systematic bits that have been interleaved by an I unit 102.

The extrinsic information for the systematic bits are de-interleaved in the DI unit 110. These de-interleaved extrinsic values for the systematic bits, the extrinsic values for the parity 1 bits, and the extrinsic values for the parity 2 bits are provided to the multiplexer and rate-matching unit 112. Unit 112 multiplexes the three streams together and performs rate matching (puncturing and repeating) as needed. Though not shown, after the last decoder operation, the decoder 56' produces standard outputs corresponding to the information bits. Extrinsic modulated bit information need not be produced then.

Figure 11:
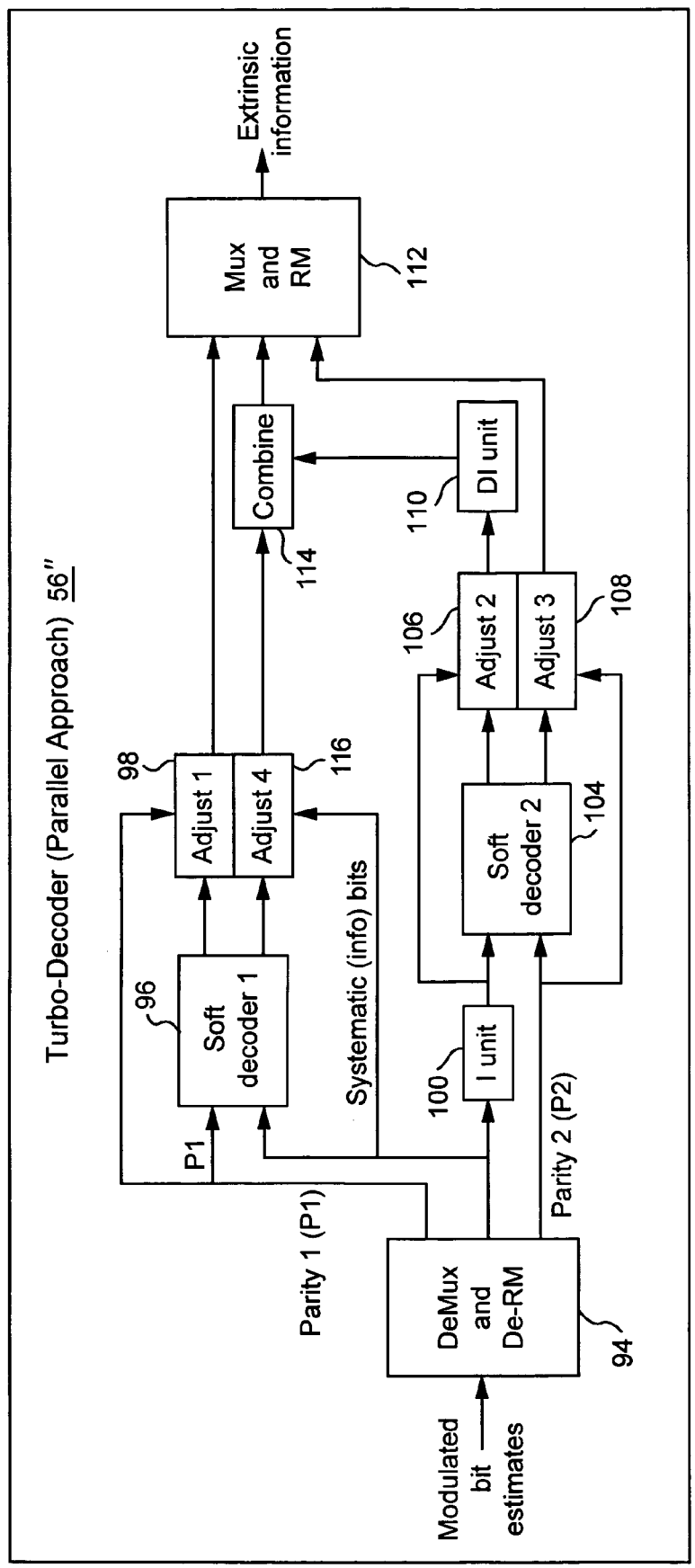
FIG. 11 is a function block diagram of an example turbo-decoder employing a parallel approach that may be used as the decoder in the turbo-equalizer of FIG. 4.

A second example embodiment of a turbo-decoder 56" is shown in FIG. 11 which uses a parallel approach to component code decoding. De-interleaved modulated bit estimates from the de-interleaver (DI) 54 are provided to the demultiplexing and de-rate-matching unit 94. The systematic bits and the parity 1 bits are provided to soft decoder 1, which performs decoding on component 1 of the turbo-code and produces soft information concerning the modulated bits using standard approaches. These soft values are adjusted in adjust unit (98) 1 and a new adjust unit 4 (116) to produce extrinsic information for the parity 1 and partial extrinsic information for the systematic bits. Soft decoder 2 performs decoding on component 2 of the turbo code and produces soft information concerning modulated bits. These values are adjusted in adjust units 2 and 3 to produce extrinsic information for the parity 2 and partial extrinsic information for the systematic bits. The partial extrinsic information for the systematic bits are de-interleaved in the DI unit 110 and added to the partial extrinsic information for the systematic bits from adjust unit 4 in combiner 114 to produce extrinsic information for the systematic bits. The extrinsic information for the systematic bits from combiner 114, the extrinsic information for the parity 1 bits from adjust 1, and the extrinsic information for the parity 2 bits from adjust 3 are provided to the multiplexer and rate-matching unit 112. Unit 112 multiplexes the three streams together and performs rate matching (puncturing, repeating) as needed. Again, though not shown, the last pass of the decoder 56" produces standard outputs corresponding to the information bits. Extrinsic modulated bit information does not need to be produced this last pass. The last pass of the decoder 56, 56', and 56" depends on the stopping criterion. Standard criterion can be used, such as a fixed number of iterations or an error detection criterion such as a CRC check. It is preferred that only one pass of the decoder be performed to avoid locking onto an incorrect solution early in the process.

Figure 12:
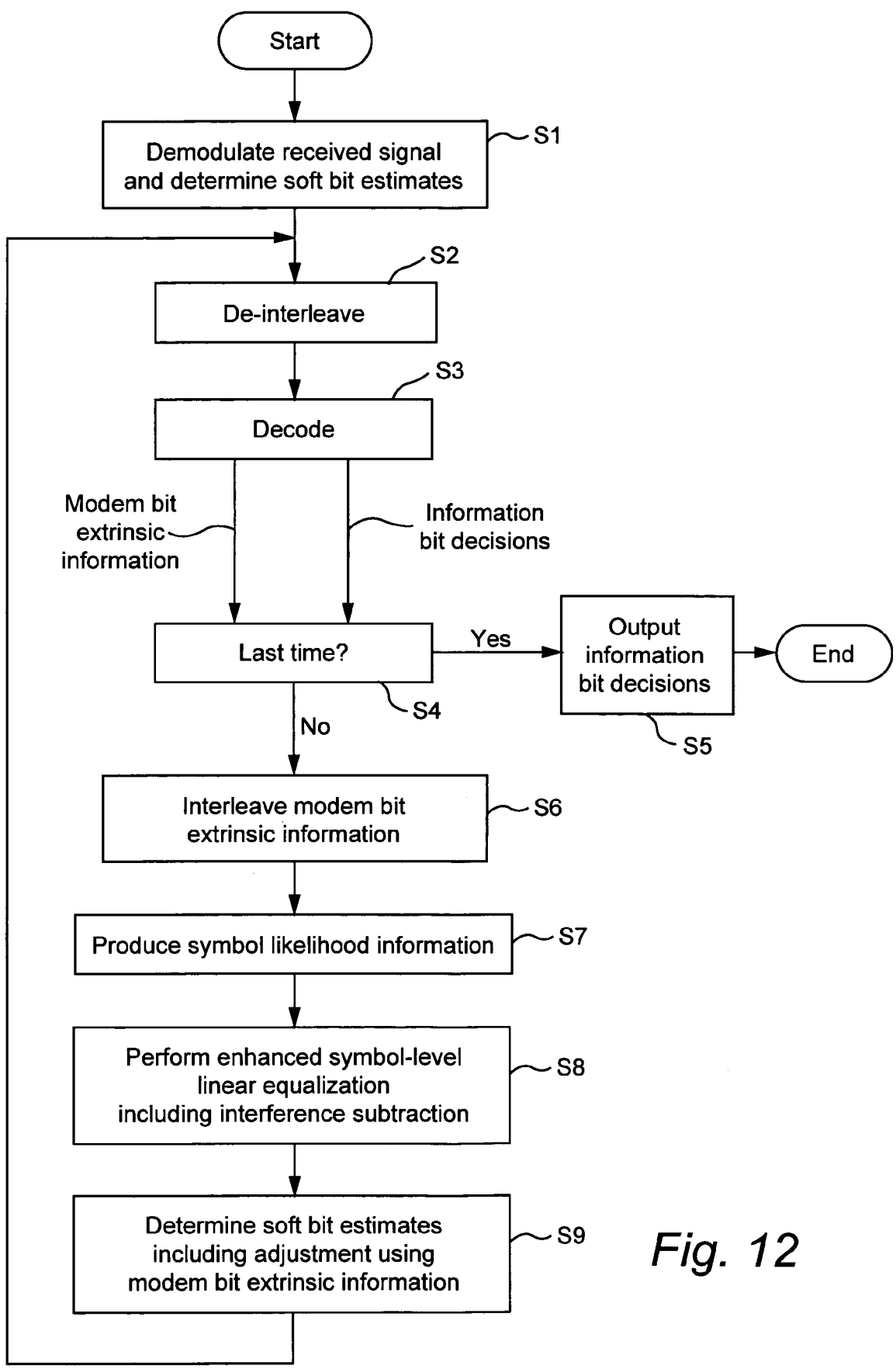
FIG. 12 is flowchart diagram outlining example, non-limiting operations that may be performed by the turbo-equalizer of FIG. 4.

A flowchart of general operations for the turbo-equalizer 18 is shown in FIG. 12. An initial step S1, the received signal is demodulated, and soft bit estimates are determined. Any suitable equalization technique can be used to perform this first step; G-Rake can, but need not, be used. The soft bit estimate values are de-interleaved in step S2. Decoding operations in the decoder are used to produce modem bit extrinsic information and information bit decisions in step S3. A decision is made in step S4 whether this is the last pass of decoder 56. If this is the last decoder pass, decoding operations are performed to produce coded information bits in step S5. If not, interleaving of modem bit extrinsic information is performed in step S6 and symbol likelihood information is produced in step S7. Enhanced, symbol-level, linear equalization is performed using the symbol likelihood information in step S8. This enhanced linear equalization includes removing interference using the symbol likelihood information. Soft bit estimates are determined including adjustment using modem bit extrinsic information provided from the decoder 56 in step S9. Control returns to the de-interleaving in step S3.

A single, multi-code user signal received in the presence of composite noise has been assumed. One extension is to express the composite noise covariance term as the sum of white and colored noise terms. In the uplink, this could model another high-rate user or some other form of interference. In the downlink, this could model other own-cell users or other-cell interference. For example, for the case of only one colored-noise term, $C_n$ can be replaced with $C_n + C_1$.

Multiple receive antennas can also be considered. Most of the equations remain the same if a Rake finger has both a delay and an antenna associated with it. Some of the specific equations need to be extended, but this is well understood. Multiple transmit antennas, such as open or closed-loop transmit diversity in the downlink can also be considered. The extension is straightforward based on how G-Rake was extended to handle these situations.

While simpler than nonlinear equalization, the linear form does require spreading code knowledge to compute combining weights and an interference cancellation term. Due to the use of long scrambling sequences, these quantities are recomputed every symbol period. In addition, during the turbo equalization process, these quantities should be recomputed every iteration. It may be reasonable to approximate the solution by forming combining weights that don't directly depend on symbol likelihoods.

Although various embodiments have been shown and described in detail, the claims are not limited to any particular embodiment or example. None of the above description should be read as implying that any particular element, step, range, or function is essential such that it must be included in the claims scope. The scope of patented subject matter is defined only by the claims. The extent of legal protection is defined by the words recited in the allowed claims and their equivalents. No claim is intended to invoke paragraph 6 of 35 USC §112 unless the words "means for" are used.

The invention claimed is:

1. A method for processing a received, direct-sequence code-division multiple-access (DS-CDMA) baseband signal to recover information bits, comprising:
    A) receiving the DS-CDMA baseband signal which includes composite noise and transmitted symbols, each transmitted symbol including one or more modulated bits;
    B) forming a first set of modulated bit estimates based on the received signal;
    C) performing a decoding operation using the first set of modulated bit estimates to produce extrinsic information associated with the modulated bits;
    D) for multiple delays of the received signal, performing a despreading operation using the received baseband signal to produce multiple despread values corresponding to a transmitted symbol;
    E) forming an interference estimate using the extrinsic information and forming a second set of modulated bit estimates using the despread values and the interference estimate; and
    F) performing decoding operations using the second set of modulated bit estimates to produce information bit estimates.

2. The method in claim 1, wherein the first set of modulated bit estimates are formed using a generalized-Rake (G-Rake) receiver.

3. The method in claim 2, wherein the generalized-Rake receiver produces symbol estimates from the despread values, and wherein the symbol estimates are used to produce modulated bit estimates.

4. The method in claim 1, wherein at least some of the decoding operations in step F) include turbo-decoding operations.

5. The method in claim 4, wherein the turbo-decoding operations include:
    in one turbo-decoding pass, performing first and second component decoding operations using the modulated bit estimates to produce the extrinsic information,
    wherein the extrinsic information is then used in step E) after the one turbo-decoding pass is completed.

6. The method in claim 4, wherein the turbo-decoding operations include:
    in a turbo-decoding pass, performing first and second component decoding operations using the modulated bit estimates to produce the extrinsic information,
    wherein the extrinsic information is then used in step E) after multiple plural turbo-decoding passes have been completed.

7. The method in claim 4, wherein the turbo-decoding operations include:
    performing a first component decoding operation using the modulated bit estimates to produce a first set of modulated bit likelihood information, and
    performing a second component decoding operation using the modulated bit estimates and the first set of modulated bit likelihood information to produce a second set of modulated bit likelihood information; and forming extrinsic information from the first and second sets of modulated bit likelihood information.

8. The method in claim 4, further comprising:
performing a first component decoding operation using the modulated bit estimates to produce a first set of modulated bit likelihood information;
performing a second component decoding operation using the modulated bit estimates to produce a second set of modulated bit likelihood information; and
combining the first and second sets of modulated bit likelihood information to produce the extrinsic information.

9. The method in claim 1, wherein the step of forming a second set of modulated bit estimates includes removing the interference estimate to produce the second modulated bit estimates.

10. The method in claim 9, further comprising:
using the extrinsic information to form an average symbol value for an interfering transmitted symbol, and
using the average symbol value to form an interference estimate of an interference associated with the transmitted symbol.

11. The method in claim 9, further comprising:
forming one set of combining weights.

12. The method in claim 11, further comprising:
removing the interference estimate from the despread values to produce modified despread values; and
combining the modified despread values using the combining weights for use in providing a symbol estimate associated with the transmitted symbol.

13. The method in claim 11, further comprising:
combining the despread values using the combining weights for use in providing a symbol estimate associated with the transmitted symbol; and
removing the interference estimate from the symbol estimate associated with a transmitted symbol.

14. The method in claim 11, further comprising:
determining the combining weights based on the extrinsic information.

15. The method in claim 14, further comprising:
using the extrinsic information to form symbol likelihoods corresponding to the transmitted symbols, and
determining the combining weights based on the symbol likelihoods.

16. The method in claim 11, wherein another set of combining weights is used in step B), the method further comprising:
determining the other set of combining weights, different from the one set of combining weights, based on channel estimates and an impairment covariance estimate.

17. The method in claim 1, wherein steps C) and E) are performed more than once before performing step F), wherein step C) operates on a modulated set of modem bit estimates.

18. The method of claim 1, wherein the modulated bit estimates correspond to transmitted symbols sent in parallel on different spreading codes.

19. The method of claim 1, wherein the modulated bit estimates correspond to higher-order modulation transmitted symbols.

20. The method in claim 1 used in a radio receiver.

21. The method in claim 20, wherein the radio receiver is in a mobile radio.

22. The method in claim 20, wherein the radio receiver is in a radio base station.

23. The method in claim 20, wherein the radio receiver includes one antenna or plural antennas, and wherein the baseband signal is received on the one antenna or on the plural antennas.

24. Apparatus for processing a received, direct-sequence code-division multiple-access (DS-CDMA) baseband signal to recover information bits, comprising processing circuitry configured to perform the following tasks:
A) receive the DS-CDMA baseband signal which includes composite noise and transmitted symbols, each transmitted symbol including one or more modulated bits;
B) form a first set of modulated bit estimates based on the received signal;
C) perform a decoding operation using the first set of modulated bit estimates to produce extrinsic information associated with the modulated bits;
D) for multiple delays of the received signal, perform a despreading operation using the received baseband signal to produce multiple despread values corresponding to a transmitted symbol;
E) form an interference estimate using the extrinsic information and forming a second set of modulated bit estimates using the despread values and the interference estimate; and
F) perform decoding operations using the second set of modulated bit estimates to produce information bit estimates.

25. The apparatus in claim 24, wherein the processing circuitry includes a generalized Rake (G-Rake) receiver for forming the first set of modulated bit estimates.

26. The apparatus in claim 25, wherein the processing circuitry includes a linear equalizer that includes the generalized Rake receiver, and wherein the linear equalizer is configured to produce symbol estimates from the despread values for use in producing modulated bit estimates.

27. The apparatus in claim 24, wherein the processing circuitry includes a turbo-decoder.

28. The apparatus in claim 27, wherein in one turbo-decoding pass, the turbo-decoder is configured to perform first and second component decoding operations using the modulated bit estimates to produce the extrinsic information,
wherein the processing circuitry is configured to use the extrinsic information in task E) after the one turbo-decoding pass is completed.

29. The apparatus in claim 27, wherein in one turbo-decoding pass, the turbo-decoder is configured to perform first and second component decoding operations using the modulated bit estimates to produce the extrinsic information,
wherein the processing circuitry is configured to use the extrinsic information in task E) after plural turbo-decoding passes are completed.

30. The apparatus in claim 27, wherein the turbo-decoder is configured to:
perform a first component decoding operation using the modulated bit estimates to produce a first set of modulated bit likelihood information, and
perform a second component decoding operation using the modulated bit estimates and the first set of modulated bit likelihood information to produce a second set of modulated bit likelihood information; and
form extrinsic information from the first and second sets of modulated bit likelihood information.

31. The apparatus in claim 27, wherein the turbo-decoder is configured to:
perform a first component decoding operation using the modulated bit estimates to produce a first set of modulated bit likelihood information;

perform a second component decoding operation using the modulated bit estimates to produce a second set of modulated bit likelihood information; and
combine the first and second sets of modulated bit likelihood information to produce the extrinsic information.

32. The apparatus in claim 24, wherein the processing circuitry includes a linear equalizer for performing the task of forming a second set of modulated symbol estimates.

33. The apparatus in claim 32, wherein the linear equalizer includes an interference estimator for forming an interference estimate and an interference remover for removing the interference estimate to produce symbol estimates from the second modulated bit estimates are obtained.

34. The apparatus in claim 33, wherein the interference estimator is configured to:
use the extrinsic information to form an average symbol value for an interfering transmitted symbol, and
use the average symbol value to form an interference estimate of an interference associated with the transmitted symbol.

35. The apparatus in claim 33, wherein the linear equalizer includes a weight processor for forming one set of combining weights.

36. The apparatus in claim 35, further comprising:
a first combiner for removing the interference estimate from the despread values to produce modified despread values; and
a second combiner for combining the modified despread values using the combining weights for use in providing a symbol estimate associated with the transmitted symbol.

37. The apparatus in claim 35, further comprising:
a first combiner for combining the despread values using the combining weights for use in providing a symbol estimate associated with the transmitted symbol; and
a second combiner for removing the interference estimate from the symbol estimate associated with a transmitted symbol.

38. The apparatus in clam 35, wherein the weight processor is configured to determine the combining weights based on the extrinsic information.

39. The apparatus in claim 38, wherein the processing circuitry includes a symbol likelihood processor for using the extrinsic information to form symbol likelihoods corresponding to the transmitted symbols,
wherein the weight processor is configured to determine the combining weights based on the symbol likelihoods.

40. The apparatus in claim 35, wherein another set of combining weights is for use in performing task B), and wherein the weight processor is configured to determine the other set of combining weights, different from the one set of combining weights, based on channel estimates of a channel over which the transmitted symbols were transmitted and an impairment covariance estimate.

41. The apparatus in claim 24, wherein the processing circuitry is configured to perform the tasks C) and E) more than once before performing the task F), wherein a second performance of task C) operates on the second set of modulated bit estimates.

42. The apparatus of claim 24, wherein the modulated bit estimates correspond to transmitted symbols sent in parallel on different spreading codes.

43. The apparatus of claim 24, wherein the modulated bit estimates correspond to higher-order modulation transmitted symbols.

44. The apparatus of claim 24 used in a radio receiver.

45. The apparatus of claim 44, wherein the radio receiver is in a mobile radio.

46. The apparatus of claim 44, wherein the radio receiver is in a radio base station.

47. The apparatus in claim 44, wherein the radio receiver includes one antenna or plural antennas, and wherein the radio receiver is configured to receive the baseband signal on the one antenna or on the plural antennas.

48. A computer-readable storage medium embodied with computer program code executable by a computer for processing a received, direct-sequence code-division multiple-access (DS-CDMA) baseband signal to recover information bits, the computer program code embodied in the computer-readable storage medium comprising:
code configured to receive the DS-CDMA baseband signal which includes composite noise and transmitted symbols, each transmitted symbol including one or more modulated bits;
code configured to form a first set of modulated bit estimates based on the received signal;
code configured to perform a decoding operation using the first set of modulated bit estimates to produce extrinsic information associated with the modulated bits;
code configured to perform a despreading operation, for multiple delays of the received signal, using the received baseband signal to produce multiple despread values corresponding to a transmitted symbol;
code configured to form an interference estimate using the extrinsic information and form a second set of modulated bit estimates using the despread values and the interference estimate; and
code configured to perform decoding operations using the second set of modulated bit estimates to produce information bit estimates.

* * * * *

UNITED STATES PATENT AND TRADEMARK OFFICE
CERTIFICATE OF CORRECTION

PATENT NO. : 7,602,838 B2
APPLICATION NO. : 11/314740
DATED : October 13, 2009
INVENTOR(S) : Bottomley et al.

It is certified that error appears in the above-identified patent and that said Letters Patent is hereby corrected as shown below:

In Column 7, Line 15, delete "tubo-equalizer" and insert -- turbo-equalizer --, therefor.

In Column 7, Line 61, delete "$R_p(\tau)$" and insert -- $R_p(\tau)$. --, therefor.

In Column 11, Line 39, delete "intererence" and insert -- interference --, therefor.

In Column 14, Line 65, in Equation "(49)", delete "$V_e(b_1,o)$" and insert -- $V_e(b_i,o)$ --, therefor.

In Column 15, Line 4, in Equation "(49)-continued", delete "$V_d(b_1,o-1)$," and insert -- $V_d(b_i,o-1)$, --, therefor.

In Column 21, Line 10, in Claim 33, after "forming" delete "an" and insert -- the --, therefor.

Signed and Sealed this

Twenty-third Day of February, 2010

David J. Kappos
*Director of the United States Patent and Trademark Office*